US010681836B2

(12) United States Patent
Bailey et al.

(10) Patent No.: US 10,681,836 B2
(45) Date of Patent: Jun. 9, 2020

(54) CONFIGURABLE FUSE BOX FOR MODULAR DATA CENTER

(71) Applicant: DELL PRODUCTS, L.P., Round Rock, TX (US)

(72) Inventors: Mark M. Bailey, Round Rock, TX (US); Anthony P. Middleton, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/960,415

(22) Filed: Apr. 23, 2018

(65) Prior Publication Data

US 2019/0327852 A1    Oct. 24, 2019

(51) Int. Cl.
*H05K 7/14* (2006.01)
*H02B 1/21* (2006.01)
*H02B 1/20* (2006.01)
*H02B 1/18* (2006.01)
*G06F 1/18* (2006.01)

(52) U.S. Cl.
CPC ............ *H05K 7/1492* (2013.01); *H02B 1/18* (2013.01); *H02B 1/202* (2013.01); *H02B 1/21* (2013.01); *H05K 7/1497* (2013.01); *G06F 1/189* (2013.01)

(58) Field of Classification Search
CPC . H02B 1/04; H02B 1/18; H02B 1/202; H02B 1/21; H05K 7/1492; H05K 7/1497; G06F 1/189
USPC ................................................. 361/627–658
See application file for complete search history.

(56) References Cited

U.S. PATENT DOCUMENTS

| | | | | |
|---|---|---|---|---|
| 2,883,587 | A * | 4/1959 | Dorfman ................ | H02B 1/056 361/635 |
| 6,617,708 | B2 * | 9/2003 | Boost ....................... | H02J 1/10 307/42 |
| 6,967,283 | B2 * | 11/2005 | Rasmussen ............. | G06F 1/189 174/50 |
| 7,619,868 | B2 * | 11/2009 | Spitaels ............... | H01R 25/003 361/115 |
| 8,446,710 | B2 | 5/2013 | Schmitt et al. | |
| 9,144,172 | B2 | 9/2015 | Bergthold et al. | |
| 9,274,572 | B2 * | 3/2016 | Bailey ..................... | G06F 1/189 |
| 9,590,404 | B2 | 3/2017 | Bailey et al. | |
| 9,733,682 | B2 * | 8/2017 | Butzer ..................... | G06F 1/26 |

* cited by examiner

*Primary Examiner* — Zachary Pape
(74) *Attorney, Agent, or Firm* — Isidore PLLC

(57) ABSTRACT

A power distribution system, modular data center (MDC), and method provide a permanent electrical enclosure sized for an eventual maximum load allowing for flexible ampacity and concurrent upgradeability. A busway is mountable in a MDC to carry three-phase AC electrical power. A three-phase electrical cable is rated to carry a maximum power value to connect to a power distribution unit (PDU) of a first rack-based information handling system (IHS) of the MDC. A bus plug is engaged to the first busway and has at least three conduction paths that electrically connect to the three-phase electrical cable. Interchangeable fused switch modules of different power ratings are selectable to be received in a fused switch module receptacle in the bus plug. A reduced power fused switch module for initial power capacity of the MDC can later be upgraded to a maximum power rating without changing anything but the fused switch module.

19 Claims, 9 Drawing Sheets

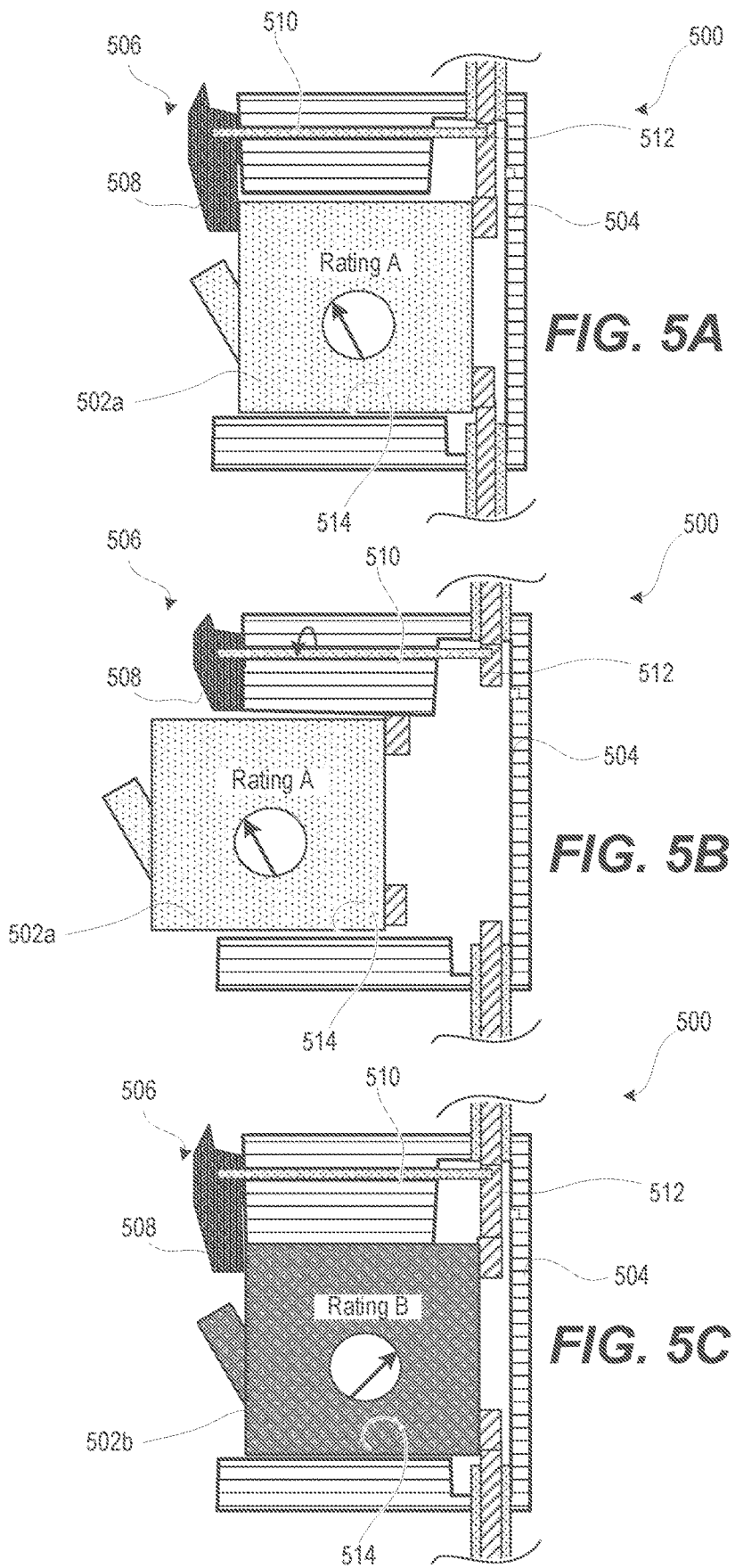

CONFIGURABLE FUSE BOX FOR MODULAR DATA CENTER

BACKGROUND

1. Technical Field

The present disclosure relates in general to power distribution to an information handling system (IHS), and more particularly to fused power distribution to IHSs of a modular distribution center (MDC).

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A data center operates a large number of IHSs to provide storage and processing for smaller client systems or for other high capacity computing needs. A modular data center is a portable version of a data center that provides an easily expandable computing capacity that is quick to set up and to get operational, without having the building construction and infrastructure worries typically associated with a traditional data center. A modular data center includes a power distribution network for providing power to the information handling systems, to environmental conditioning equipment such as heating ventilation and air conditioning (HVAC) units and air handlers, and to other auxiliary loads. Typically sizing of a power distribution system of a data center is based on power requirements of an initial configuration of rack-based IHSs. The power distribution system devices, such as a power distribution unit (PDU), are sized to support the power requirement of the initial configuration. All components of the power distribution system that provide power to the PDU, including bus plug, breakers, power cord, connections, etc., are selected for the power requirement of the initial configuration. Current trends, however, are for data centers to upgrade from lower density to higher density rack capacities with a corresponding increase in power requirements. Power distribution component sizing and upgrading is not flexible and does not facilitate upgrading to higher power capacity.

BRIEF SUMMARY

In accordance with the teachings of the present disclosure, a power distribution system includes a first busway that is mountable in a modular data center (MDC). The first busway has at least three power busbars that respectively carry one phase of three-phase alternating current electrical power. A first three-phase electrical cable is rated to carry a maximum power value and is connected to a power distribution unit (PDU) of a first rack-based information handling system (IHS) of the MDC. A first bus plug is engaged to the first busway. The first bus plug has at least three conduction paths that electrically connects each one of the at least three power busbars to a respective conductor of the three-phase electrical cable with the at least three conduction paths interrupted at a fused switch module receptacle of the first bus plug. A selected one of more than one interchangeable fused switch modules is received in the fused switch module receptacle of the first bus plug to complete the at least three conduction paths. Selection is made from a first fused switch module that is rated to carry the maximum power value and a second fused switch module of one or more lower-rated fused switch modules that are respectively rated to carry less than the maximum power value. Each fused switch module has a separate breaker for each of the at least three conduction paths.

According to aspects of the present innovation, a MDC includes an information technology (IT) module and a power distribution system. The power distribution system includes a first busway mountable in the IT module. The first busway has at least three power busbars that respectively carry one phase of three-phase alternating current electrical power. The power distribution system includes a first three-phase electrical cable rated to carry a maximum power value and positionable in the MDC to connect to a PDU of a first rack-based IHS of the MDC. A first bus plug is engaged to the first busway. The first bus plug has at least three conduction paths that electrically connect each one of the at least three power busbars to a respective conductor of the three-phase electrical cable with the at least three conduction paths interrupted at a fused switch module receptacle of the first bus plug. A selected one of more than one interchangeable fused switch modules is received in the fused switch module receptacle of the first bus plug to complete the at least three conduction paths. Selection is made from a first fused switch module that is rated to carry the maximum power value and a second fused switch module of one or more lower-rated fused switch modules that are respectively rated to carry less than the maximum power value. Each fused switch module has a separate breaker for each of the at least three conduction paths.

According to illustrative embodiments of the present disclosure, a method is provided for distributing upgradeable three-phase electrical power within a MDC. The method includes mounting a first busway of a power distribution system in an IT module of a MDC. The method includes attaching a first bus plug to the first busway to electrically connect input ends of at least three conduction paths of the first bus plug to respective ones of at least three busbars of the first busway. The method includes attaching output ends of the at least three conduction paths of the first bus plug to an input connector of a first three-phase electrical cable rated to carry a maximum power value. The method includes connecting an output connection of the first three-phase electrical cable to a PDU of a first rack-based IHS of the MDC that is configured to consume a selected one of: (i) the maximum power value; and (ii) a reduced power value that is less than the maximum power value. The method includes inserting, in a fused switch module receptacle of the first bus plug to complete the at least three conduction paths, a selected one of: (i) a first fused switch module that is rated for the maximum power value; and (ii) a second fused switch module that is rated for the reduced power value.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIGS. 5A-5C are a sequence of side cross sectional views of a bus plug at different stages of replacing a fused switch module in a bus plug using an example rotary locking switch to upgrade a power distribution system, according to one or more embodiments;

DETAILED DESCRIPTION

According to aspects of the present innovation, a power distribution system, modular data center (MDC), and method provide a permanent electrical enclosure sized for an eventual maximum load, while allowing for flexible ampacity and concurrent upgradeability. A first busway is mountable in a MDC. The first busway has at least three power busbars that respectively carry one phase of three-phase alternating current electrical power. In one or more embodiments, a fourth power bar can carry an electrical neutral voltage. A first three-phase electrical cable is rated to carry a maximum power value to connect to a power distribution unit (PDU) of a first rack-based information handling system (IHS) of the MDC. A first bus plug is engaged to the first busway. The first bus plug has at least three conduction paths electrically connect each one of the at least three power busbars to a respective conductor of the three-phase electrical cable with the at least three conduction paths interrupted at a fused switch module receptacle of the first bus plug. A selected one of more than one interchangeable fused switch modules is received in the fused switch module receptacle of the first bus plug to complete the at least three conduction paths. The interchangeable fused switch module is selected from a first fused switch module that is rated to carry the maximum power value and a second fused switch module of one or more lower-rated fused switch modules that are respectively rated to carry less than the maximum power value. Each fused switch module has a separate breaker for each of the at least three conduction paths. A reduced power fused switch module for initial power capacity of the MDC can later be upgraded to a maximum power rating without changing any components of the power distribution system but the fused switch module.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

Figure 1:
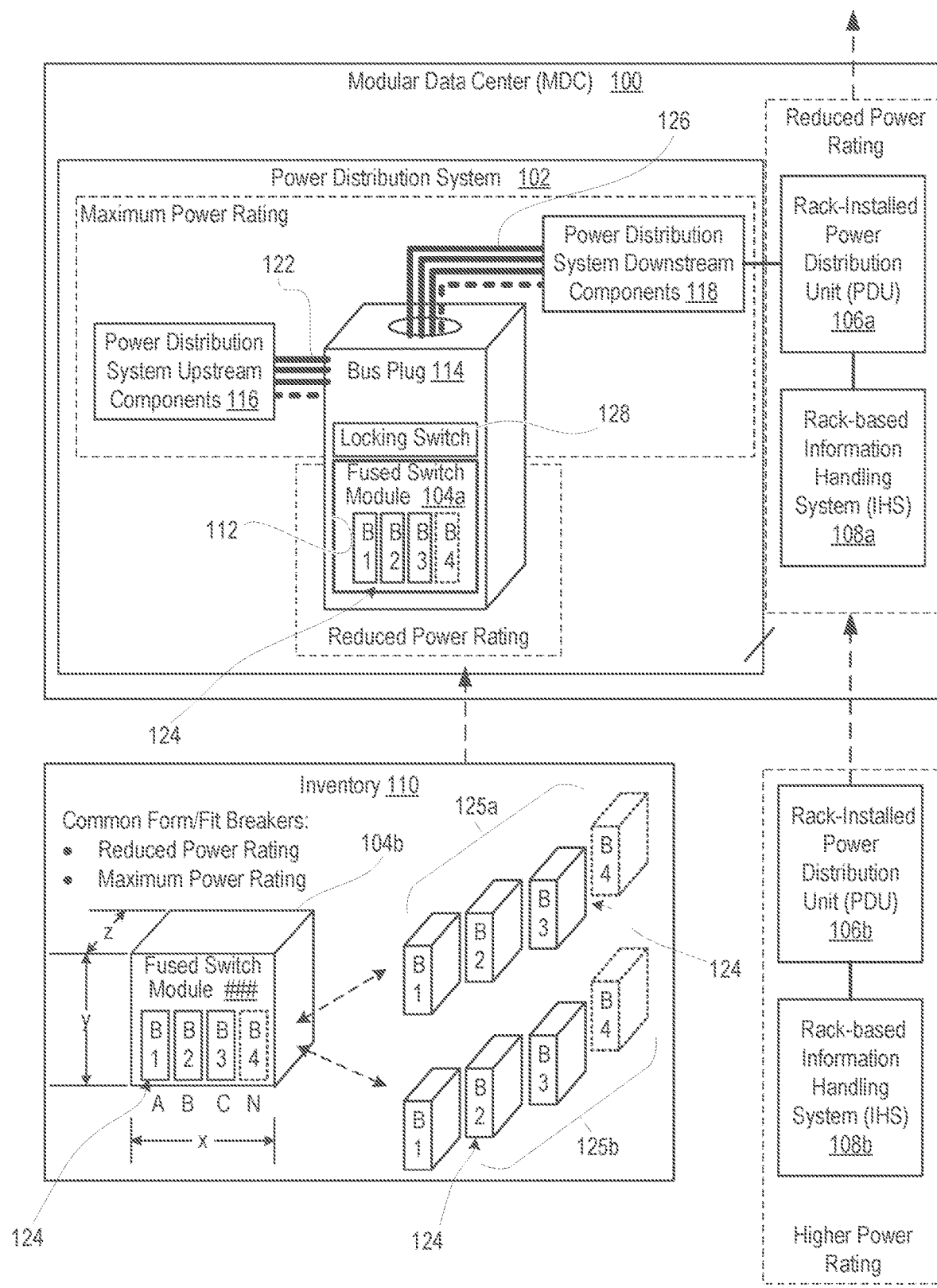
FIG. 1 is a block diagram representation of an upgradeable power distribution system of a modular data center (MDC), according to one or more embodiments.

FIG. 1 is block diagram representation of a MDC 100 having a power distribution system 102 that is upgradeable to a higher power rating by replacing a first fused switch module 104a. The first fused switch module 104a that is initially installed has reduced power rating that corresponds to a rack-installed PDU 106a and rack-based IHS 108a. When configuring or upgrading MDC 100 with a higher power rated PDU 106b and rack-based IHS 108b, a higher power rated fused switch module 104b is selected from inventory 110 and inserted in receptacle 112 of bus plug 114 to complete the upgrade to power distribution system 102. Upstream and downstream components 116, 118 of the power distribution system 102 as well as a bus plug 114 that houses the interchangeable first and second fused switch modules 104a-104b have maximum power rating to accommodate higher power requirements. Upstream components 116 of the power distribution system 102 include a busway 122 that carries 3-phase electrical power (A, B, C) and can include carrying a neutral (N) conductor. First and second fused switch modules 104a-104b have a fuse or breaker (B1-B4) 124 for each power phase or neutral conduction path. In one or more embodiments, breakers 124 are integral to the first and second fused switch modules 104a-104b with a respective power rating of each breaker 124 being the same. In one or more embodiments, breakers 124 are individually replaceable. A set 125a of breakers 124 having a maximum power rating can be selected to replace a set 125b of breakers 124 that have a reduced power rating. In certain scenarios, the power rating of individual breakers 124 can be different from other breakers in a set. Downstream components 118 of the power distribution system 102 include 3-phase power whip or cord 126 that carries the 3-phase electrical power and can include carrying the neutral conductor.

When replacing first and second fused switch modules 104a, a locking switch 128 on the bus plug 114 is moved to an unlocked position. First busway 122 remains energized and live components within the receptacle 112 of the bus plug 114 are not exposed. Bus plug 114 can also be removed from the first busway 122 in order to remove power so that cord/conduit attachments can be made.

Although MDC upgrades generally create a need for greater levels of power distribution within an IT module, aspects of the present innovation allow for reducing the power distribution. Requirements for compute workloads can be reduced or rack-based IHSs can become available that are more energy efficient. The power distribution system retains an ability to be expeditiously upgraded to a maximum power rating.

Figure 2:
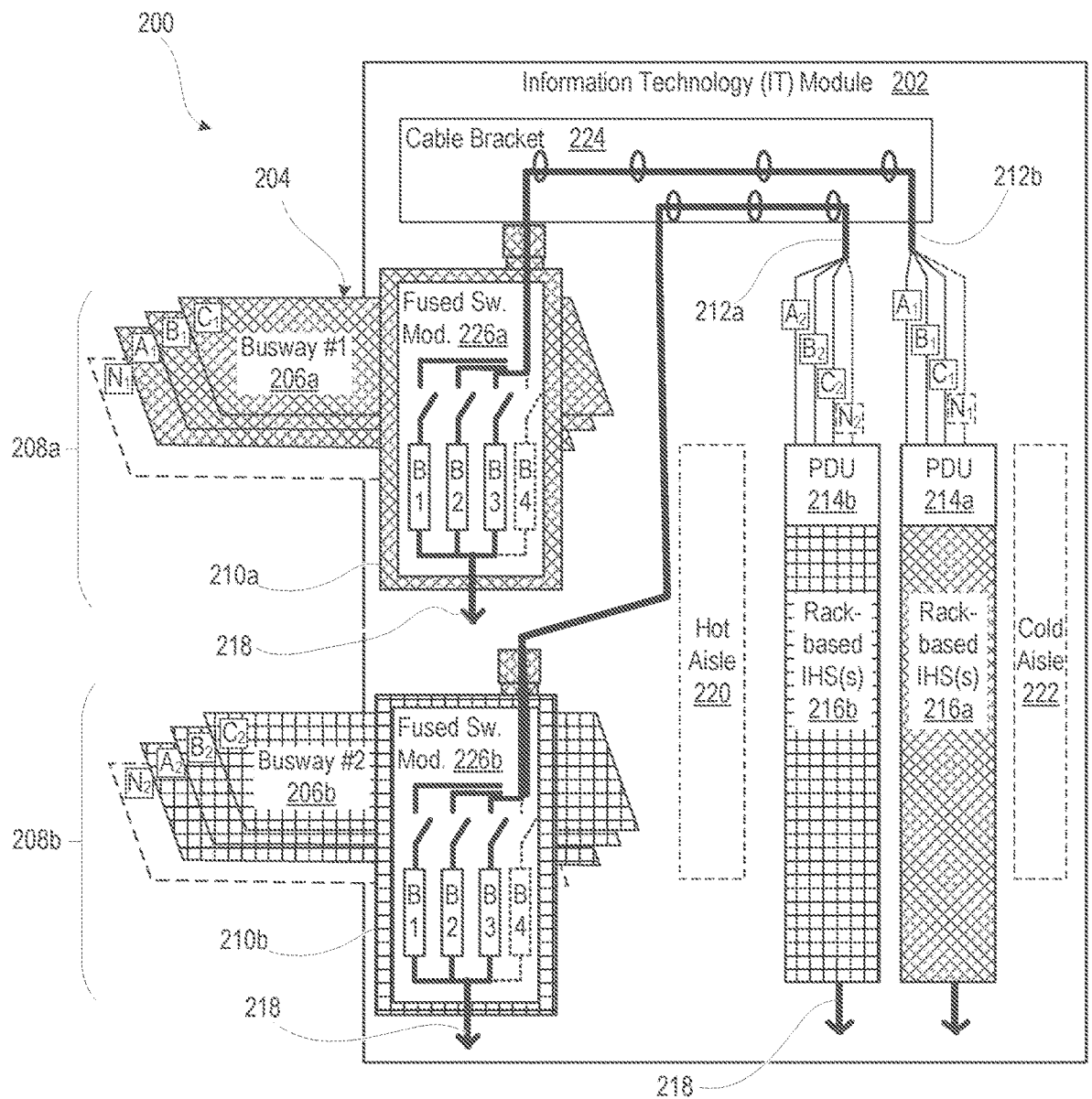
FIG. 2 is a block diagram representation of an information technology (IT) module having an upgradeable power distribution system of dual busways, according to one or more embodiments.

FIG. 2 is a diagrammatic representation of a MDC 200 having an IT module 202 with a dual busway power distribution system 204 of first and second busways 206a-206b. An upper power distribution subsystem 208a includes the first busway 206a, first bus plug 210a, and whip or cord 212a that delivers 3-phase electrical power ($A_1$, $B_1$, $C_1$ and possibly $N_1$) to rack-installed PDUs 214a of rack-based IHS(s) 216a. A lower power distribution subsystem 208b includes the second busway 206b, second bus plug 210b, and whip or cord 212b that delivers 3-phase electrical power ($A_2$, $B_2$, $C_2$ and possibly $N_2$) to rack-installed PDUs 214b of rack-based IHS(s) 216b. Components of dual busway power distribution system 204, rack-installed PDUs 214a-214b, and rack-based IHS(s) 216a-216b can include grounding connections 218 to an internal ground or an earth ground. In one or more embodiments, rack-based IHS(s) 216a-216b are placed in a row between hot aisle 220 and cold aisle 222 of IT module 202. Dual busway power distribution system 204 is installed adjacent to hot aisle 220. Cords 212a-212b are supported by cable bracket 224. First (upper) and second (lower) fused switch modules 226a-226b are inserted respectively in bus plugs 210a-210b to carry an amount of power as required by respective rack-based IHS(s) 216a-216b.

In one or more embodiments, at least portion of the first busway 206a, the first bus plug 226a, and the first three-phase electrical cable 212a have a humanly perceptible distinguishing characteristic such color or texture or annotation from at least a portion of second busway 206b, the second bus plug 226b, and the second three-phase electrical cable 212b.

Figure 3A:
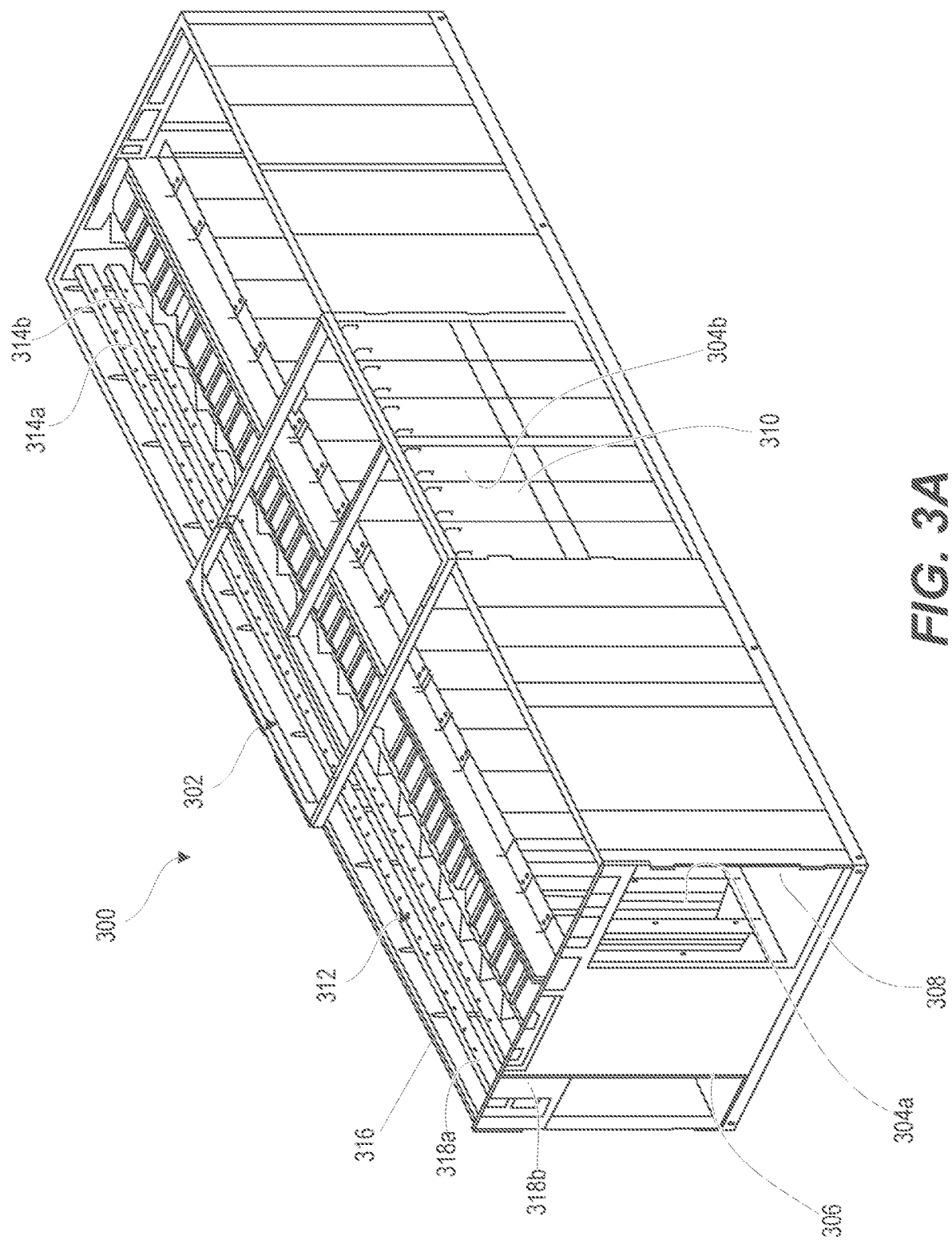
FIG. 3A is an isometric, cutaway view of an example IT module of a MDC with a dual busway power distribution system, according to one or more embodiments.

FIG. 3A is an isometric, cutaway view of an example MDC 300 having an IT module enclosure 302 having open slots 304a for receiving rack-based IHS(s) (not shown) placed in a row between hot aisle 306 and cold aisle 308. Doors 310 provide an air seal for other closed slots 304b to force cooling air through open slots 304a. Dual busway power distribution system 312 with upper and lower busways 314a-314b are installed on a back wall 316 adjacent to hot aisle 306. Upper and lower cable tap boxes 318a-318b connect respectively to upper and lower busways 314a-314b. Power distribution can be extended to corresponding busways in an adjacent IT module (not shown) by connecting to upper and lower cable tap boxes 318a-318b.

Figure 3B:
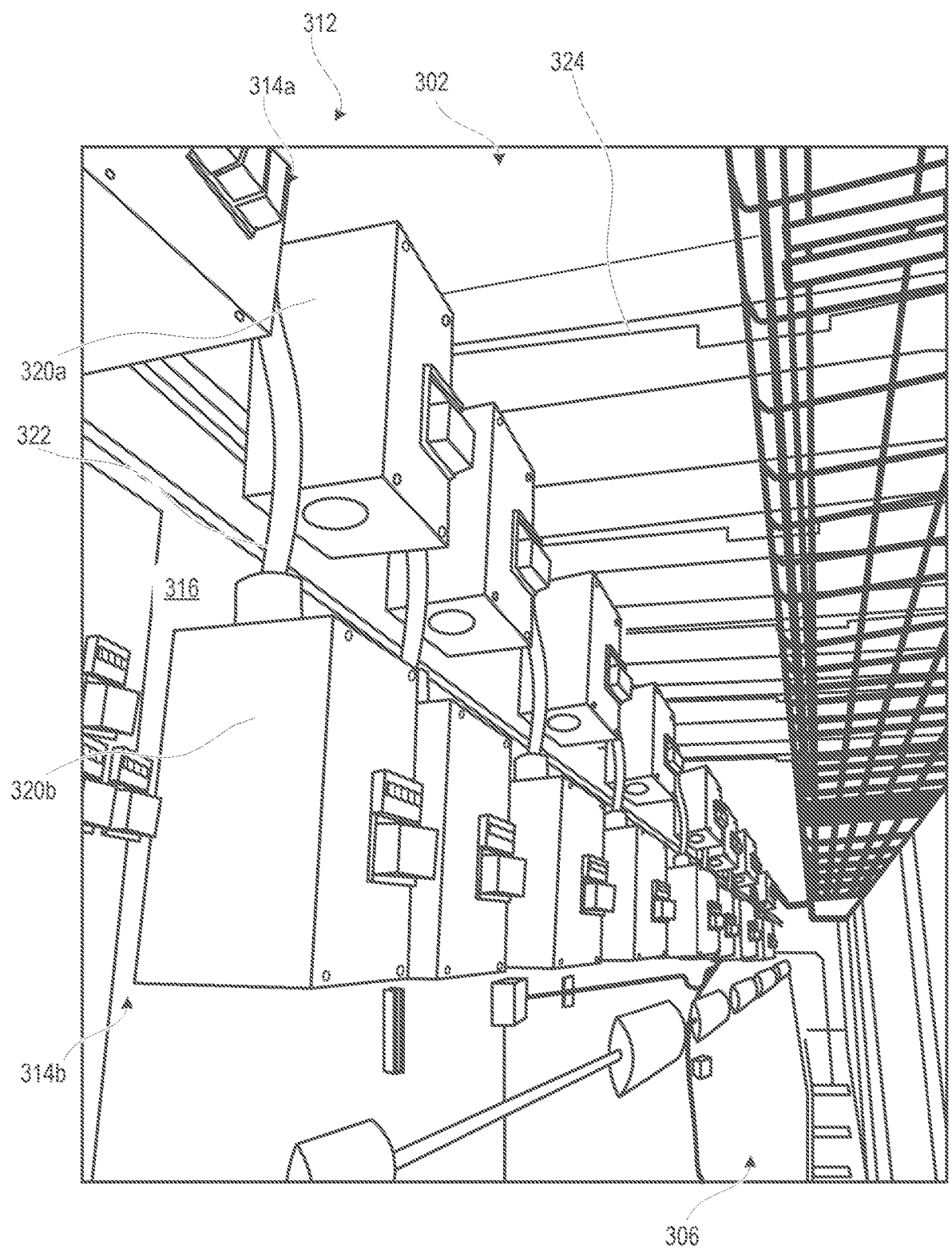
FIG. 3B is an isometric view of a hot aisle of an example IT module with a dual busway power distribution system, according to one or more embodiments.

FIG. 3B is an isometric view of hot aisle 306 of IT module 302 of MDC 300 with dual busway power distribution system 312. Upper bus plugs 320a are attached to upper busway 314a and lower bus plugs 318b are attached to lower busway 314b. Power whip or cords 322 from each upper and lower bus plug 318a-318b are routed above the hot aisle 306 and carried on cable brackets 324.

FIGS. 4A-4F are a sequence of side cross sectional views of a bus plug 404 at different stages of replacing a first fused switch module 402a with a second fused switch module 402b by using an example linear locking switch 406. Replacement can be prompted by a failure of the first fused switch module 402a. Replacement can also be prompted by a requirement to upgrade a power distribution system 400 to a different power rating. For clarity, a conceptual locking switch 406 is part of a simple locking mechanism 408 whose operation is readily viewable in a two-dimensional view. Locking mechanism 408 provides functions of: (i) physically locking and unlocking the first fused switch module 402a in fused switch module receptacle 410 of the bus plug 404; (ii) electrically disconnecting conductors 412 that are exposed in the fused switch module receptacle 410 when first fused switch module 402a is removed. Other mechanical and electromechanical locking features can be implemented to provide the same functionality.

Figure 4A:
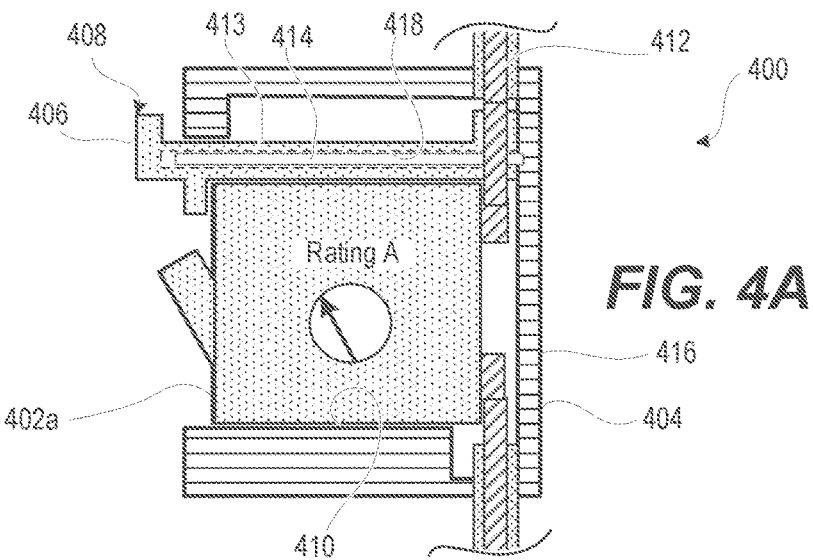
FIGS. 4A-4F are a sequence of side cross sectional views of a bus plug at different stages of replacing a fused switch module using an example linear locking switch to upgrade a power distribution system, according to one or more embodiments.
Figure 4B:
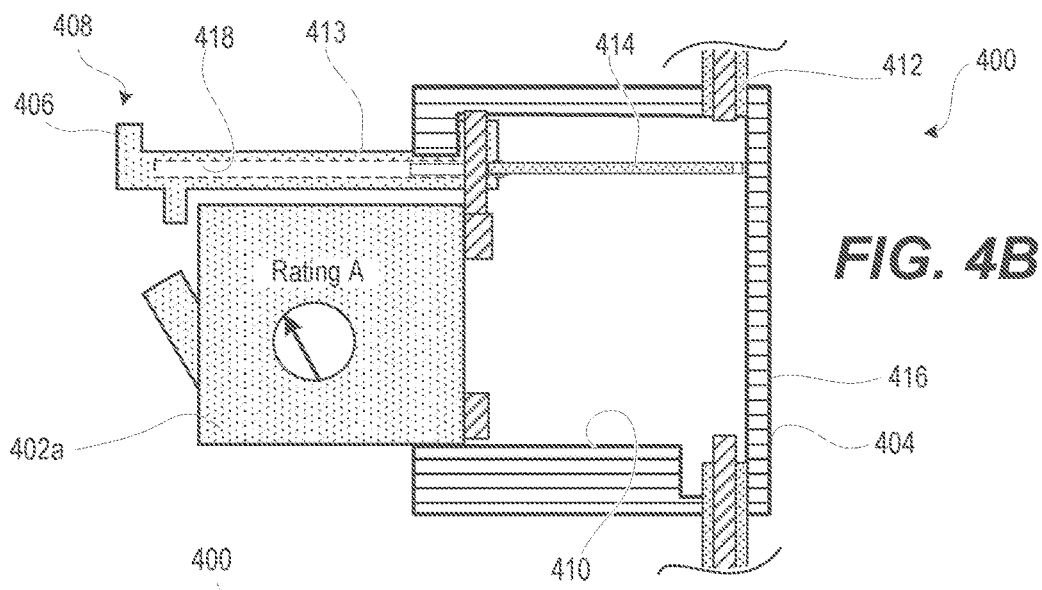
Figure 4C:
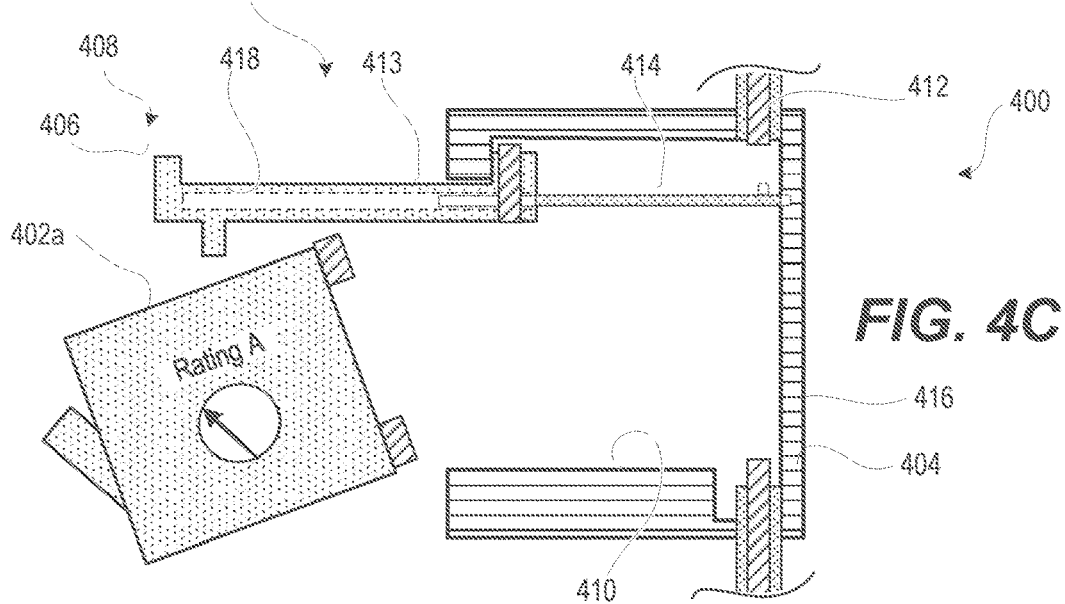
Figure 4D:
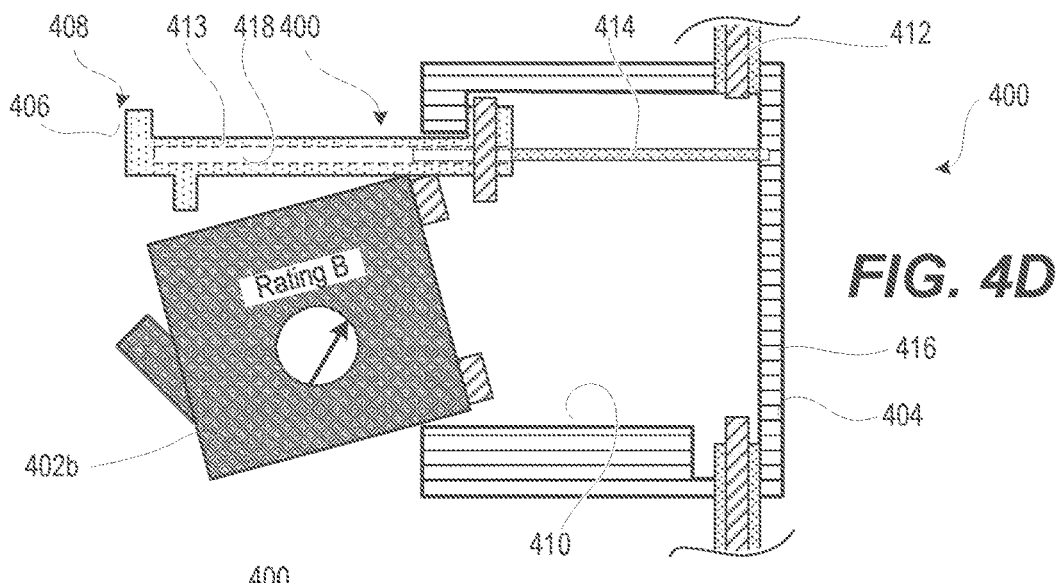
Figure 4E:
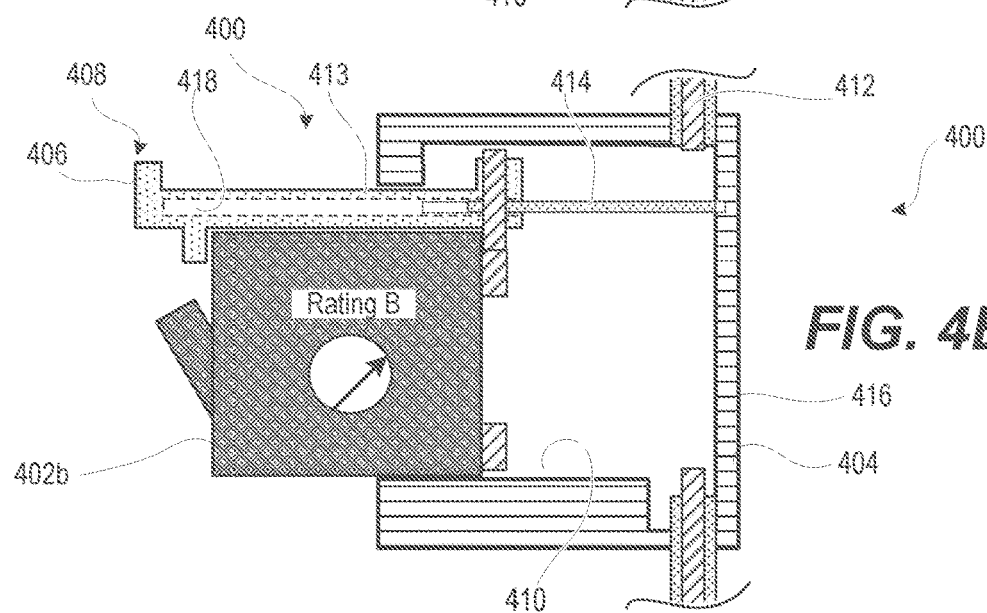
Figure 4F:
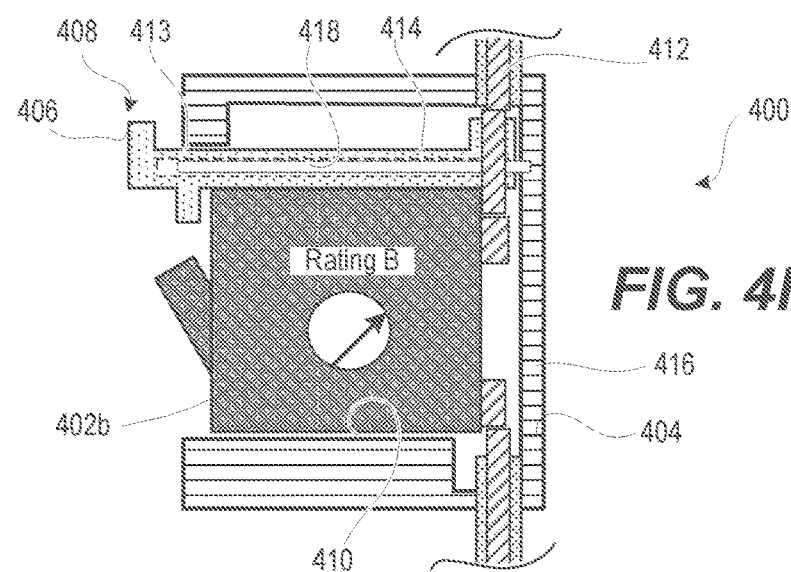

FIG. 4A illustrates the power distribution system 400 in an operational state at reduced power rating A as provided and limited by first fused switch module 402a. Locking mechanism 408 includes a linear actuator 413 guided by a forward directed spindle 414 that projects from a chassis 416 of bus plug 404 above fused switch module receptacle 410. Spindle 414 is fully received within a rearward open bore 418 of linear actuator 413 in the locked position. FIG. 4B illustrates linear actuator 413 pulled forward, disconnecting electrical power within fused switch module receptacle 410 of the bus plug 404 and pulling out first fused switch module 402a. FIG. 4C illustrates first fused switch module 402a removed from the linear actuator 413. FIG. 4D illustrates second fused switch module 402b being inserted into the linear actuator 413. FIG. 4E illustrates linear actuator 413 being moved rearward, which moves second fused switch module 402b into fused switch module receptacle 410. FIG. 4F illustrates the power distribution system 400 in an operational state at increased power rating B as provided and limited by second fused switch module 402b with locking switch 410 in a locked position.

FIGS. 5A-5C are a sequence of side cross sectional views of a bus plug 504 at different stages of replacing a first fused switch module 502a with a second fused switch module 502b by using an example rotary locking switch 506. Replacement can be prompted by a failure of the first fused switch module 502a. Replacement can also be prompted by a requirement to upgrade a power distribution system 500 to a different power rating. FIG. 5A illustrates the power distribution system 500 in an operational state at reduced power rating A as provided and limited by first fused switch module 502a. Rotary locking switch 506 is in a locked state. FIG. 5B illustrates rotary locking switch 506 rotated a quarter turn, moving an asymmetric knob 508 to physically release first fused switch module 502a. A spindle 510 extending rearward from asymmetric knob 508 rotates a conductor arm 512 from a vertical conducting position to a horizontal isolated position, removing power to fused switch module receptacle 514. FIG. 5C illustrates the power distribution system 500 in an operational state at increased power rating B, as provided and limited by second fused switch module 502*b* with rotary locking switch 506 rotated back a quarter turn to a locked position.

Figure 6:
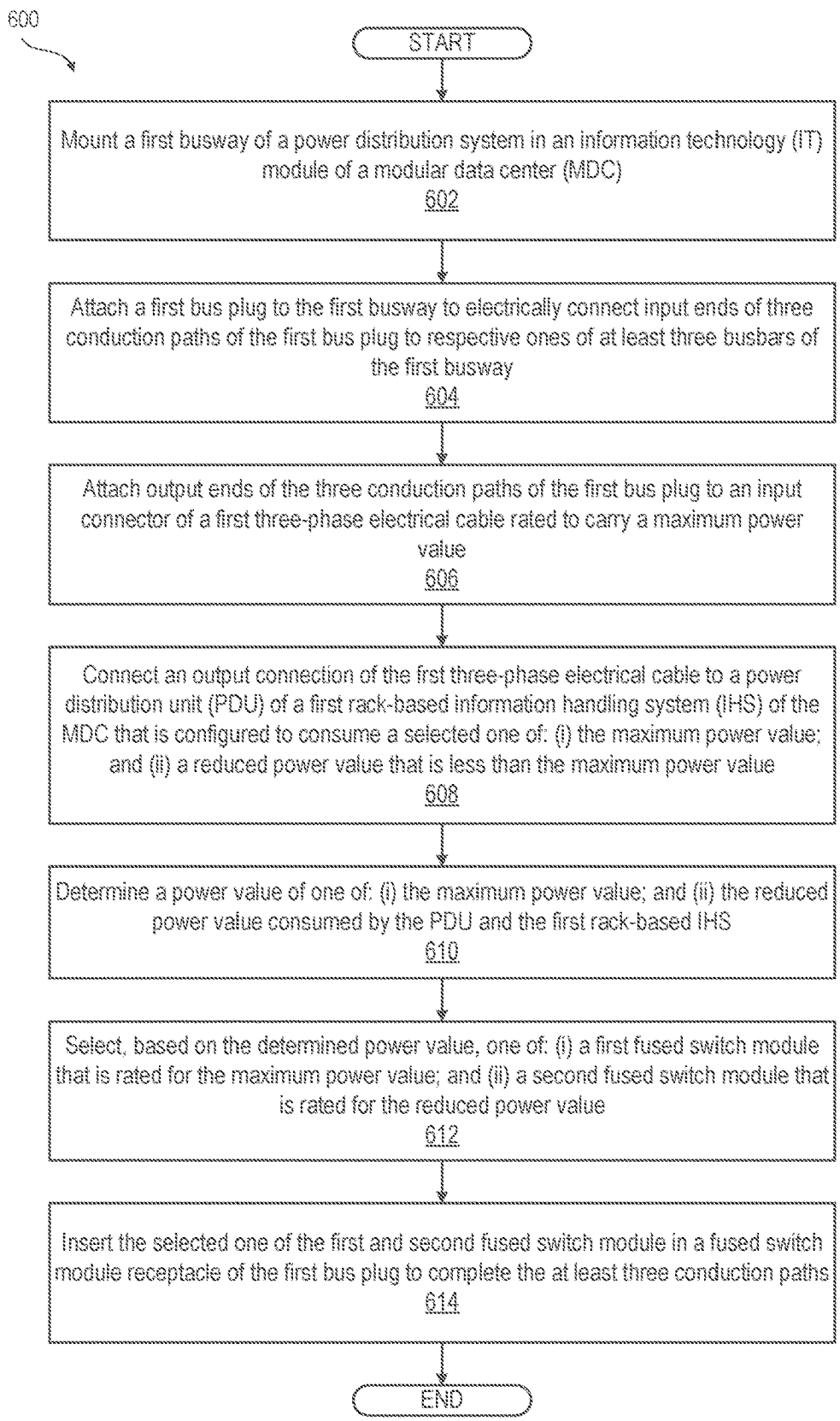
FIG. 6 is a flow diagram of a method of installing a power distribution system in an IT module to support rack-based IHSs, according to one or more embodiments.

FIG. 6 is a flow diagram of a method 600 of installing a power distribution system in an IT module to support rack-based IHSs, according to one or more embodiments. Method 600 begins by mounting a first busway of a power distribution system in an IT module of a MDC (block 602). Method 600 includes attaching a first bus plug to the first busway to electrically connect input ends of at least three conduction paths of the first bus plug to respective ones of at least three busbars of the first busway (block 604). Method 600 includes attaching output ends of the at least three conduction paths of the first bus plug to an input connector of a first three-phase electrical cable rated to carry a maximum power value (block 606). Method 600 includes connecting an output connection of the first three-phase electrical cable to a PDU of a first rack-based IHS of the MDC that is configured to consume a selected one of: (i) the maximum power value; and (ii) a reduced power value that is less than the maximum power value (block 608). Method 600 includes determining a power value of one of: (i) the maximum power value; and (ii) the reduced power value consumed by the PDU and the first rack-based IHS (block 610). Method 600 includes selecting, based on the determined power value, one of: (i) a first fused switch module that is rated for the maximum power value; and (ii) a second fused switch module that is rated for the reduced power value (block 612). Method 600 includes inserting the selected one of the first and second fused switch module in a fused switch module receptacle of the first bus plug to complete the at least three conduction paths (block 614). Then method 600 ends.

Figure 7:
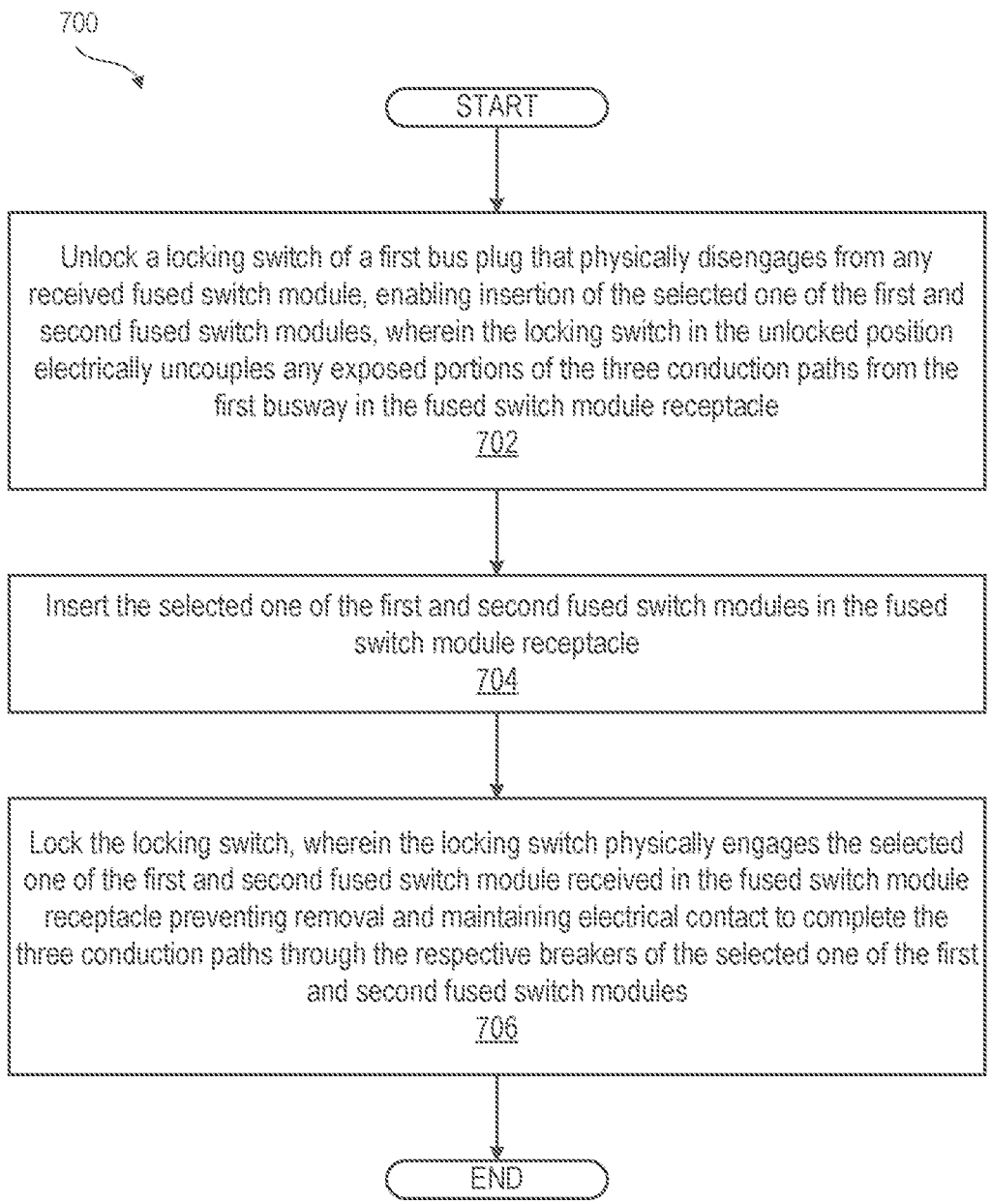
FIG. 7 is a flow diagram of a method of replacing a fused switch module with a higher power rated fused switch module, according to one or more embodiments.

FIG. 7 is a flow diagram of a method 700 of replacing a fused switch module with a higher power rated fused switch module, according to one or more embodiments. Method 700 begins by unlocking a locking switch of a first bus plug. Unlocking the locking switch physically disengages the locking switch from any fused switch module received in the fused switch module receptacle. Placing locking switch in the unlocked position enables removal of any existing fused switch module and/or insertion of the selected one of the first and second fused switch modules. The locking switch in the unlocked position electrically uncouples any exposed portions of the at least three conduction paths from the first busway in the fused switch module receptacle (block 702). Method 700 includes inserting, in the fused switch module receptacle, the selected fused switch module from among the first and second fused switch modules (block 704). Method 700 includes locking the locking switch (block 706). The locking switch in the locked position physically engages the selected one of the first and second fused switch module received in the fused switch module receptacle, preventing removal. The locking switch in the locked position also creates and maintains electrical contact to complete the at least three conduction paths through the respective breakers of the selected one of the first and second fused switch modules (block 706). Then method 700 ends.

In the above described flow charts of FIGS. 6-7, one or more of the methods may be embodied in an automated assembly controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A power distribution system comprising:
a first busway mountable in a modular data center (MDC) and having at least three power busbars that respectively carry one phase of three-phase alternating current electrical power;
a first three-phase electrical cable rated to carry a maximum power value and that connects to a power distribution unit (PDU) of a first rack-based information handling system (IHS) of the MDC;
a first bus plug engaged to the first busway and comprising at least three conduction paths that electrically connect each one of the at least three power busbars to a respective conductor of the three-phase electrical cable, interrupted at a fused switch module receptacle of the first bus plug;
a selected one of more than one interchangeable fused switch modules that are received in the fused switch module receptacle of the first bus plug and that are selected from a first fused switch module that is rated to carry the maximum power value and a second fused switch module of one or more lower-rated fused switch modules that are respectively rated to carry less than the maximum power value, each fused switch module having a separate breaker for each of the at least three conduction paths; and
a locking mechanism from among a linear locking switch and a rotary locking switch for physically locking and unlocking the fused switch modules in the fused switch module receptacle of the first bus plug and for electrically disconnecting conductors that are exposed in the fused switch module receptacle when a fused switch module is removed, the locking mechanism associated with the first bus plug.

2. The power distribution system of claim 1, wherein the locking mechanism of the first bus plug further comprises one of the linear and the rotary locking switch having locked and unlocked positions, wherein:
the locking switch in the locked position physically engages any fused switch module received in the fused switch module receptacle preventing replacement and maintaining electrical contact to complete the at least three conduction paths through the respective breakers of the corresponding one of the first and second fused switch modules; and
the locking switch in the unlocked position physically disengages from any received fused switch module, enables insertion of the selected one of the first and second fused switch modules, and electrically uncouples any exposed portions of the at least three conduction paths from the first busway in the fused switch module receptacle.

3. The MDC of claim 2, wherein the locking switch comprises the linear locking switch that includes a linear actuator guided by a forward directed spindle that projects from a chassis of the first bus plug, wherein the spindle is fully received in a rearward open bore of the liner actuator in the locked position.

4. The MDC of claim 2, wherein the locking switch comprises the rotary locking switch that includes a knob, and wherein rotation of the knob, while the fused switch module is inserted into the first bus plug, enables a spindle extending rearward from the knob to rotate a conductor arm from a vertical conducting position to a horizontal isolated position.

5. The power distribution system of claim 1, further comprising:
a second busway mountable in the MDC and having at least three power busbars that respectively carry one phase of three-phase alternating current electrical power;
a second three-phase electrical cable rated to carry a maximum power value and positionable to connect to a PDU of a second rack-based IHS of the MDC;
a second bus plug engaged to the second busway and comprising at least three conduction paths that electrically connect each one of the at least three power busbars to a respective conductor of the three-phase electrical cable with the at least three conduction paths interrupted at a fused switch module receptacle of the second bus plug; and
a selected one of more than one interchangeable fused switch modules that are received in the fused switch module receptacle of the second bus plug to complete the at least three conduction paths and are selected from another first fused switch module that is rated to carry the maximum power value and another second fused switch module of one or more fused switch modules that are respectively rated to carry less than the maximum power value.

6. The power distribution system of claim 5, wherein at least a portion of the first busway, the first bus plug, and the first three-phase electrical cable have a humanly perceptible distinguishing characteristic from at least a portion of the second busway, the second bus plug, and the second three-phase electrical cable.

7. A modular data center (MDC) comprising:
an information technology (IT) module; and
a power distribution system comprising:
a first busway mountable in the IT module and having at least three power busbars that respectively carry one phase of three-phase alternating current electrical power;
a first three-phase electrical cable rated to carry a maximum power value and positionable in the MDC to connect to a power distribution unit (PDU) of a first rack-based information handling system (IHS) of the MDC;
a first bus plug engaged to the first busway and comprising at least three conduction paths that electrically connect each one of the at least three power busbars to a respective conductor of the three-phase electrical cable with the at least three conduction paths interrupted at a fused switch module receptacle of the first bus plug;
a selected one of more than one interchangeable fused switch modules that are received in the fused switch module receptacle of the first bus plug to complete the at least three conduction paths and that are selected from a first fused switch module that is rated to carry the maximum power value and a second fused switch module of one or more fused switch modules that are respectively rated to carry less than the maximum power value, each fused switch module having a separate breaker for each of the three conduction paths; and a locking mechanism from among a linear locking switch and a rotary locking switch for physically locking and unlocking the fused switch modules in the fused switch module receptacle of the first bus plug and for electrically disconnecting conductors that are exposed in the fused switch module receptacle when a fused switch module is removed, the locking mechanism associated with the first bus plug.

8. The MDC of claim 7, wherein the locking mechanism of the first bus plug further comprises one of the linear and the rotary locking switch having locked and unlocked positions, wherein:

the locking switch in the locked position physically engages any fused switch module received in the fused switch module receptacle preventing replacement and maintaining electrical contact to complete the at least three conduction paths through the respective breakers of the corresponding one of the first and second fused switch modules; and the locking switch in the unlocked position physically disengages from any received fused switch module enabling insertion of the selected one of the first and second fused switch modules, and electrically uncouples any exposed portions of the at least three conduction paths from the first busway in the fused switch module receptacle.

9. The MDC of claim 7, further comprising:

a second busway mountable in the MDC and having at least three power busbars that respectively carry one phase of three-phase alternating current electrical power;

a second three-phase electrical cable rated to carry a maximum power value and positionable to connect to a PDU of a second rack-based IHS of the MDC;

a second bus plug engaged to the second busway and comprising at least three conduction paths that electrically connect each one of the at least three power busbars to a respective conductor of the three-phase electrical cable with the at least three conduction paths interrupted at a fused switch module receptacle of the second bus plug; and a selected one of more than one interchangeable fused switch modules that are received in the fused switch module receptacle of the second bus plug to complete the at least three conduction paths and are selected from a first fused switch module that is rated to carry the maximum power value and one or more fused switch modules that are respectively rated to carry less than the maximum power value.

10. The MDC of claim 9, wherein at least a portion of the first busway, the first bus plug, and the first three-phase electrical cable have a humanly perceptible distinguishing characteristic from at least a portion of the second busway, the second bus plug, and the second three-phase electrical cable.

11. The MDC of claim 7, wherein the locking switch comprises the linear locking switch that includes a linear actuator guided by a forward directed spindle that projects from a chassis of the first bus plug, wherein the spindle is fully received in a rearward open bore of the liner actuator in the locked position.

12. The MDC of claim 7, wherein the locking switch comprises the rotary locking switch that includes a knob, and wherein rotation of the knob, while the fused switch module is inserted into the first bus plug, enables a spindle extending rearward from the knob to rotate a conductor arm from a vertical conducting position to a horizontal isolated position.

13. A method comprising:

mounting a first busway of a power distribution system in an information technology (IT) module of a modular data center (MDC);

attaching a first bus plug to the first busway to electrically connect input ends of at least three conduction paths of the first bus plug to respective ones of at least three busbars of the first busway;

attaching output ends of the at least three conduction paths of the first bus plug to an input connector of a first three-phase electrical cable rated to carry a maximum power value;

connecting an output connection of the first three-phase electrical cable to a power distribution unit (PDU) of a first rack-based information handling system (IHS) of the MDC that is configured to consume a selected one of: (i) the maximum power value; and (ii) a reduced power value that is less than the maximum power value;

inserting in a fused switch module receptacle of the first bus plug to complete the at least three conduction paths a selected one of: (i) a first fused switch module that is rated for the maximum power value; and (ii) a second fused switch module that is rated for the reduced power value; and providing a locking mechanism from among a linear locking switch and a rotary locking switch for physically locking and unlocking the fused switch modules in the fused switch module receptacle of the first bus plug and for electrically disconnecting conductors that are exposed in the fused switch module receptacle when a fused switch module is removed, the locking mechanism associated with the first bus plug.

14. The method of claim 13, wherein inserting the selected one of the first and second fused switch modules comprises:

unlocking the locking switch of the locking mechanism of the first bus plug that physically disengages from any received fused switch module, enabling insertion of the selected one of the first and second fused switch modules, wherein the locking switch in the unlocked position electrically uncouples any exposed portions of the at least three conduction paths from the first busway in the fused switch module receptacle;

inserting the selected one of the first and second fused switch modules in the fused switch module receptacle; and locking the locking switch, wherein the locking switch physically engages the selected one of the first and second fused switch module received in the fused switch module receptacle preventing removal and maintaining electrical contact to complete the at least three conduction paths through the respective breakers of the selected one of the first and second fused switch modules.

15. The method of claim 13, further comprising:

mounting a second busway of the power distribution system in the IT module of the MDC;

attaching a second bus plug to the second busway to electrically connect input ends of at least three conduction paths of the second bus plug to respective ones of at least three busbars of the second busway;

attaching output ends of the at least three conduction paths of the second bus plug to an input connector of a second three-phase electrical cable rated to carry a maximum power value;

connecting an output connection of the second three-phase electrical cable to a PDU of a second rack-based IHS of the MDC that is configured to consume a selected one of: (i) the maximum power value; and (ii) a reduced power value that is less than the maximum power value; and interchangeably inserting in a fused switch module receptacle of the second bus plug to complete the at least three conduction paths a corresponding one of: (i) another first fused switch module that is rated for the maximum power value; and (ii) another second fused switch module that is rated for the reduced power value.

16. The method of claim 15, wherein at least a portion of the first busway, the first bus plug, and the first three-phase electrical cable have a humanly perceptible distinguishing characteristic from at least a portion of the second busway, the second bus plug, and the second three-phase electrical cable.

17. The method of claim 13, further comprising:
determining a power value of one of: (i) the maximum power value; and (ii) the reduced power value consumed by the PDU and the first rack-based IHS; and
selecting one of the first and second fused switch modules based on the determined power value.

18. The method of claim 13, wherein the locking switch comprises the linear locking switch that includes a linear actuator guided by a forward directed spindle that projects from a chassis of the first bus plug, wherein the spindle is fully received in a rearward open bore of the liner actuator in the locked position.

19. The method of claim 13, wherein the locking switch comprises the rotary locking switch that includes a knob, and wherein rotation of the knob, while the fused switch module is inserted into the first bus plug, enables a spindle extending rearward from the knob to rotate a conductor arm from a vertical conducting position to a horizontal isolated position.

* * * * *